United States Patent
Mielke et al.

(12) 
(10) Patent No.: US 6,807,658 B2
(45) Date of Patent: Oct. 19, 2004

(54) SYSTEMS AND METHODS FOR PERFORMING CLOCK GATING CHECKS

(75) Inventors: David James Mielke, Fort Collins, CO (US); Gayvin E Stong, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 48 days.

(21) Appl. No.: 10/163,391

(22) Filed: Jun. 5, 2002

(65) Prior Publication Data

US 2003/0229870 A1 Dec. 11, 2003

(51) Int. Cl.[7] .............................................. G06F 17/50
(52) U.S. Cl. ............................ 716/6; 327/145; 716/2; 716/5; 716/17
(58) Field of Search ............................ 327/145; 716/2, 716/5, 6, 17, 1, 4; 714/56, 1, 5, 6

(56) References Cited

U.S. PATENT DOCUMENTS 5,371,416 A * 12/1994 Atriss et al. ................ 327/145
5,657,239 A * 8/1997 Grodstein et al. ............. 716/6
2002/0087921 A1 * 7/2002 Rodriguez ................... 714/56

* cited by examiner

Primary Examiner—Thuan Do

(57) ABSTRACT

A gating signal checker system and method are provided to perform clock gating check on a logic cell. In accordance with one aspect of the invention, the system includes logic that determines a clock transition time of a clock input into the logic cell, and logic that determines a transition time of at least one gating signal input into the logic cell. Also included in the gating signal checker system is logic that calculates a clock difference time between the clock transition time and the transition time of the at least one gating signal input into the logic cell, and logic that determines that the logic cell fails the clock gating check if the clock difference time is negative. In accordance with another aspect of the invention, a method performs a clock gating check on a logic cell by determining a clock transition time of a clock input into the logic cell, and determining a transition time of at least one gating signal input into the logic cell. Then, the method calculates a clock difference time between the clock transition time and the transition time of the at least one gating signal input into the logic cell, and determines that the logic cell passes the clock gating check if the clock difference time is positive.

28 Claims, 9 Drawing Sheets

SYSTEMS AND METHODS FOR PERFORMING CLOCK GATING CHECKS

BACKGROUND OF THE INVENTION

1. Field of the Invention

The present invention generally relates to computer-aided circuit design systems, and more particularly to a clock gating check system and method for performing clock gating checks on logic cells.

2. Discussion of the Related Art

Integrated circuits (ICs) are electrical circuits comprising transistors, resistors, capacitors, and other components on a single semiconductor "chip" in which the components are interconnected to perform a variety of functions. Typical examples of ICs include, microprocessors, programmable logic devices (PLDs), electrically erasable programmable read only memory devices (EEPROMs), random access memory devices (RAMs), operational amplifiers and voltage regulators. A circuit designer typically designs the IC by creating a circuit schematic indicating the electrical components and their interconnections. Often, designs are simulated by computer to verify functionality and to ensure that performance goals are satisfied.

In electrical device engineering, the design and analysis work involved in producing electronic devices is often performed using electronic computer-aided design (E-CAD) tools. As will be appreciated, electronic devices include analog, digital, mixed hardware, optical, electromechanical, and a variety of other electrical devices. The design and subsequent simulation of any circuit, very large scale integration (VLSI) chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools utilize an electronic representation of the hardware device. A "netlist" is one common electronic representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules," which are used repetitively throughout the larger circuit. A flat netlist will contain multiple copies of the circuit modules essentially containing no boundary differentiation between the circuit modules and other components in the device. By way of analogy, a graphical representation of a flat netlist is the schematic of the circuit device.

In contrast, a hierarchical netlist will only maintain one copy of a circuit module, which may be used in multiple locations. By way of analogy, a graphical representation of a hierarchical netlist shows the basic and/or non-repetitive devices in schematic form and the more complex and/or repetitive circuit modules are represented by "black boxes." As will be appreciated by those skilled in the art, a black box is a system or component whose inputs, outputs, and general function of which are known, but the contents of which are not shown. These "black box" representations, hereinafter called "modules," will mask the complexities therein, typically showing only input/output ports.

An IC design can be represented at different levels of abstraction, such as at the register-transfer level (RTL) and at the logic level, using a hardware description language (HDL). VHDL® and Verilog® are examples of HDL languages. At any abstraction level, an IC design is specified using behavioral or structural descriptions, or a mix of both. At the logical level, the behavioral description is specified using Boolean equations. The structural description is represented as a netlist of primitive cells. Examples of primitive cells are, among others, full-adders, logic gates, latches, and flip-flops.

Set forth above is some very basic information regarding integrated circuits and circuit schematics that are represented in netlists. Systems are presently known that use the information provided in netlists to evaluate circuit timing and other related parameters. More specifically, systems are known that perform a timing analysis of circuits using netlist files. Although the operational specifics may vary from system to system, such systems generally operate by identifying certain critical timing paths, and then evaluating the circuit to determine whether timing violations occur through the critical paths. As is known, timing specifications may be provided to such systems by way of a configuration file.

FIG. 1A is a block diagram of a static timing analyzer system 2, as is known in the prior art. Specifically, some examples of system 2 are marketed under the name Primetime® and Pathmill®. FIG. 1A illustrates the informational flow in a system 2. At the center of the diagram is a static timing analyzer 10, (i.e., the Primetime® program). Surrounding this block 10 are a number of other blocks that represent various input and output files and/or information.

More particularly, the static timing analyzer 10 may utilize a configuration file 12, a file of timing models 14, one or more netlist files 16, a technology file 18, and a parasitics file 20, for various input information. In addition, the static timing analyzer 10 may generate a number of different output files or other output information, including a critical path report 22, a runtime log file 24, an error report 26, and a software interface file 28. When started, the static timing analyzer 10 first processes the input netlist file(s) 16, the technology file 18, and the configuration files 12. The information from these files is subsequently used for performing path analyses. The function and operation of the static timing analyzer 10 are generally well known, and therefore need not be discussed in detail herein.

While tools such as these are useful for the design verification process after layout, there are various shortcomings in the static timing analyzer 10, and other similar products. These shortcomings include, but are not limited to, performing accurate clock gating checks on logic cells during static timing. Problems with clock gating occur when a logic cell is used to turn a clock on or off based upon other logic signals. One problem occurs when the clock signal changes state at or near the same time that the logic signal changes state as to create what is referred to as a timing "glitch." These timing glitches can cause erroneous circuit operations. The most common method for preventing glitches is a clock gating check. It is nearly impossible to perform a clock gating check manually in a large design because a large design may have tens of thousands of logic cells each requiring a clock gating check.

The clock gating check ensures that the clock transition does not too closely precede or follow a change in the gating signal 43. This is shown in FIG. 1B, where the clock signal 42 and gating signal 43 are input into logic cell 41, and the output of logic cell 41 is the output signal 48. As stated above, the clock gating check makes sure that the transition of the clock signal 42 does not too closely precede or follow a transition in the gating signal 43, thereby creating glitches on the output signal 48. A comparison of these signals illustrating the potential problem is illustrated in FIG. 1C. First, the clock signal 42 has a clock transition time 44 that is approximately equal to the gating signal transition time 46 of the gating signal 43. This input of the clock signal 42 and the gating signal 43 into logic cell 41 can create an output signal 48 with a glitch 49.

Clock gating checks usually include a safety margin factor or buffer time period that is set at the time of the static timing analysis. This buffer time period 51 is illustrated in FIGS. 2A–2C. If the static timing engine calculates that the signals are far enough apart in time, then the clock gating check passes as illustrated in FIG. 2A. As shown, the clock signal 42 transitions at clock transition time 44 and the buffer time period 51 expires prior to the gating signal transition time 46 of the gating signal 43. In this scenario, the transition of clock signal 42 and gating signal 43 allows a sufficient time for the buffer time period 51.

A problem with the clock gating check occurs if the signals (i.e. the clock signal 42 and gating signal 43) have poor or slow transition times. However, if the clock transition time 44 of the clock signal 42 overlaps the gating signal transition time 46 of the gating signal 43, then the clock gating check will also fail as shown in FIG. 2B. In addition, there is a problem with the clock gating check of the prior art if the clock signal 42 and gating signal 43 have poor transition times that may be greater than the buffer time period 51, but that still sufficiently overlap to cause glitches as illustrated in FIG. 2C.

Consequently, there is a heretofore unaddressed need existing in the industry for a way to address the aforementioned deficiencies and inadequacy.

SUMMARY OF THE INVENTION

The present invention provides a gating signal analysis system and method for performing accurate clock gating analysis on logic cells. Briefly described, in architecture, the gating signal checker can be implemented as follows. The gating signal checker has logic that determines a clock transition time of a clock input into the logic cell, and logic that determines a transition time of at least one gating signal input into the logic cell. Also included in the gating signal checker system is logic that calculates a clock difference time between the clock transition time and the transition time of the at least one gating signal input into the logic cell, and logic that determines that the logic cell fails the clock gating check if the clock difference time is negative.

The invention can also be viewed as providing one or more methods for performing accurate clock gating checks on logic cells. In this regard, one such method can be summarized by the following steps: (1) determining a clock transition time of a clock input into the logic cell, (2) determining a transition time of at least one gating signal input into the logic cell, (3) calculating a clock difference time between the clock transition time and the transition time of the at least one gating signal input into the logic cell, and (4) determining that the logic cell passes the clock gating check if the clock difference time is positive.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Having summarized various aspects of the present invention, the invention will now be described in detail with reference to the drawings. While the invention will be described in connection with these drawings, there is no intent to limit it to the embodiment or embodiments disclosed therein. On the contrary, the intent is to cover all alternatives, modifications and equivalents included within the spirit and scope of the invention as protected by the appended claims.

In one embodiment, the gating signal checker of the present invention checks the real transition period of a logic cell for correct transition operation. This is superior to previous methods in that it does not require a pre-calculation of a safety margin that is to be used. In another embodiment, the gating signal checker of the present invention also allows for significantly different transition periods between the clock and gating signals, and even between the individual gating signals if there is more than one.

In another embodiment, the gating signal checker of the present invention operates by determining the signal transition times in reference to a clock, and determining the transition times of all of the gating signals for one gating cell. Upon determining these signal transition times, the clock transition period can be determined. Each gating signal is compared to the clock signal for both set up and hold, both in transition period and in transition time. The transition time indicates the point at which the signal changes from one state to another. The transition period is the time period needed for a signal to completely transition from one state to another.

The following formula can be applied to determine if the circuit being analyzed passes/fails the clock gating check.

$$C - \frac{A+B}{2} - D + E\frac{(A+B)}{2} < 0, \text{ then gating check fails.} \quad \text{(Eq. 1)}$$

If the time between the gating signal and the clock signal (Factor C), minus one-half of the transition period for clock transition (Factor A) and gating signal transition (Factor B) is greater than or equal to zero, then no transition overlap has occurred and the clock gating check will pass. One-half transition period is used to ensure that transitions signals have fully transitioned. This is used because a signal is considered fully transitioned in clock gating at 50% transition. If the value computed after subtraction is less than zero, then the clock gating check will fail.

It is possible to have an allowable overlap percent (Factor E) that can be specified for each type of signal. This would allow overlap up to a percentage amount specified while still passing the clock signal check. If extra time is desired, the designer can also specify an extra buffer time period (Factor D) that would be included between the signals being tested.

Figure 3:
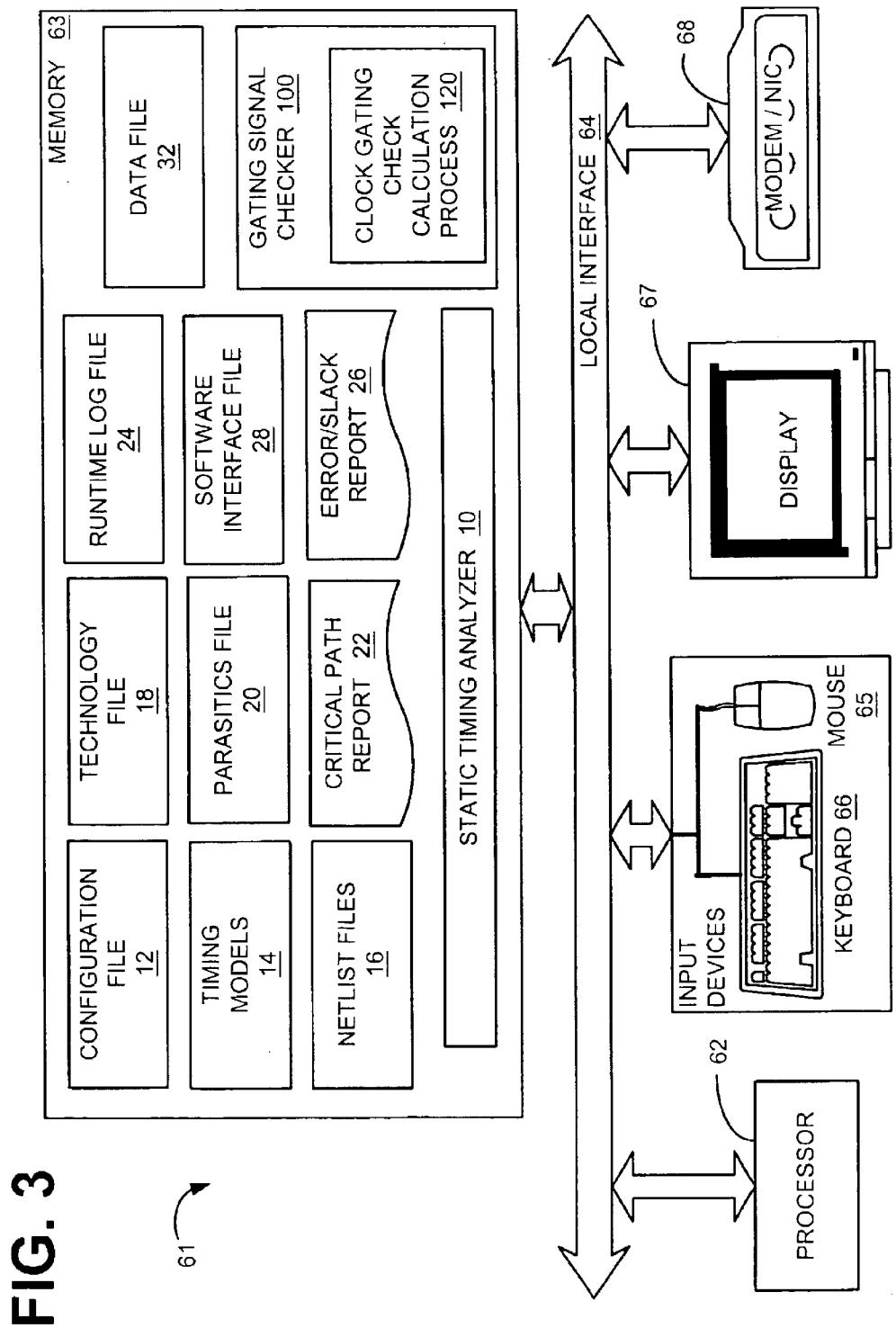
FIG. 3 is a block diagram illustrating one possible implementation of a gating signal checker that utilizes a clock gating check calculation process, situated within a computer readable medium.

FIG. 3 is a block diagram illustrating one possible implementation of a gating signal checker 100 that utilizes the clock gating check calculation process 120 of the present invention, situated within a computer readable medium, such as, for example, a memory 63 in a general-purpose computer system 61. A general-purpose computer system can identify, access, and process resources desired by a user.

Generally, in terms of hardware architecture, as shown in FIG. 3, the computer system 61 includes a processor 62, memory 63, and one or more input devices and/or output (I/O) devices (or peripherals) that are communicatively coupled via a local interface 64. The local interface 64 can be, for example but not limited to, one or more buses or other wired or wireless connections, as is known in the art. The local interface 64 may have additional elements, which are omitted for simplicity, such as controllers, buffers (caches), drivers, repeaters, and receivers, to enable communications. Further, the local interface 64 may include address, control, and/or data connections to enable appropriate communications among the aforementioned components.

The processor 62 is a hardware device for executing software that can be stored in memory 63. The processor 62 can be virtually any custom made or commercially available processor, a central processing unit (CPU) or an auxiliary processor among several processors associated with the computer system 61, and a semiconductor based microprocessor (in the form of a microchip) or a macroprocessor. Examples of suitable commercially available microprocessors are as follows: an 80x86 or Pentium series microprocessor from Intel Corporation, U.S.A., a PowerPC microprocessor from IBM, U.S.A., a Sparc microprocessor from Sun Microsystems, Inc, a PA-RISC series microprocessor from Hewlett-Packard Company, U.S.A., or a 68xxx series microprocessor from Motorola Corporation, U.S.A.

The memory 63 can include any one or a combination of volatile memory elements (e.g., random access memory (RAM, such as DRAM, SRAM, etc.)) and nonvolatile memory elements (e.g., ROM, hard drive, tape, CDROM, etc.). Moreover, the memory 63 may incorporate electronic, magnetic, optical, and/or other types of storage media. Note that the memory 63 can have a distributed architecture, where various components are situated remote from one another, but can be accessed by the processor 62.

The software in memory 63 may include one or more separate programs, each of which comprises an ordered listing of executable instructions for implementing logical functions. In the example of FIG. 3, the software in the memory 63 includes an operating system (not shown), configuration file 12, file of timing models 14, one or more netlist files 16, technology file 18, and a parasitics file 20, containing various input information. The critical path report 22, runtime log file 24, error report 26, software interface file 28, and data file 32 output files or other output information are also situated in memory 63. The gating signal checker 100 is used to perform clock gating checks herein defined in further detail with regard to FIGS. 4–6.

A non-exhaustive list of examples of suitable commercially available operating systems is as follows: a Windows operating system from Microsoft Corporation, U.S.A., a Netware operating system available from Novell, Inc., U.S.A., an operating system available from IBM, Inc., U.S.A., any LINUX operating system available from many vendors or a UNIX operating system, which is available for purchase from many vendors, such as Hewlett-Packard Company, U.S.A., Sun Microsystems, Inc. and AT&T Corporation, U.S.A. The operating system essentially controls the execution of other computer programs, such as the checksum code operation mechanism, and provides scheduling, input-output control, file and data management, memory management, and communication control and related services.

The gating signal checker 100 that utilizes the clock gating check calculation process 120 may be a source program, executable program (object code), script, or any other entity comprising a set of instructions to be performed. When a source program, then the program is usually translated via a compiler, assembler, interpreter, or the like, which may or may not be included within the memory 63, so as to operate properly in connection with the O/S. Furthermore, the gating signal checker 100 that utilizes clock gating check calculation process 120 can be written as (a) an object oriented programming language, which has classes of data and methods, or (b) a procedure programming language, which has routines, subroutines, and/or functions, for example but not limited to, C, C++, Pascal, BASIC, FORTRAN, COBOL, Perl, TCL, Java, and Ada.

The I/O devices may include input devices, for example but not limited to, a keyboard 66, mouse 65, scanner, microphone, etc. Furthermore, the I/O devices may also include output devices, for example but not limited to, a printer, display 67, etc. Finally, the I/O devices may further include devices that communicate both inputs and outputs, for instance but not limited to, a modulator/demodulator (modem; for accessing another device, system, or network) 68, a radio frequency (RF) or other transceiver, a telephonic interface, a bridge, a router, etc.

If the computer system 61 is a PC, workstation, or the like, the software in the memory 63 may further include a basic input output system (BIOS) (omitted for simplicity). The BIOS is a set of essential software routines that initialize and test hardware at startup, start-up the O/S, and support the transfer of data among the hardware devices. The BIOS is stored in ROM so that the BIOS can be executed when the computer system 61 is activated.

When the computer system 61 is in operation, the processor 62 is configured to execute software stored within the memory 63, to communicate data to and from the memory 63, and to generally control operations of the computer system 61 pursuant to the software. The gating signal checker 100 that utilizes the clock gating check calculation process 120 and the O/S are read, in whole or in part, by the processor 62, perhaps buffered within the processor 62, and then executed.

The gating signal checker 100 that utilizes the clock gating check calculation process 120 can be implemented in hardware, software, firmware or a combination thereof. In the preferred embodiment, the gating signal checker 100 with the clock gating check calculation process 120 is implemented in software or firmware that is stored in a memory, such as the system memory 63, and that is executed by a suitable instruction execution system, such as processor 62.

Figure 4:
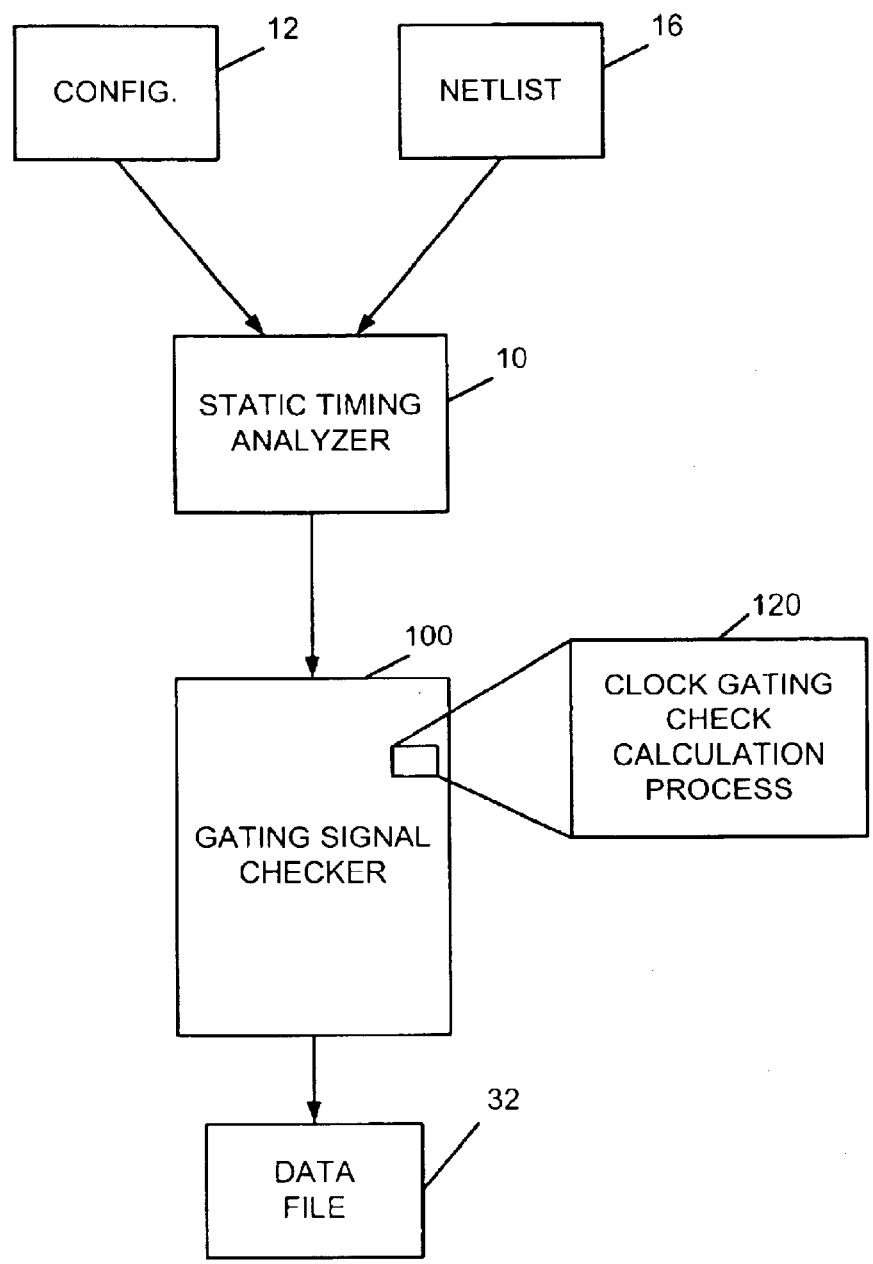
FIG. 4 is a block diagram illustrating one possible implementation of the gating signal checker with the clock gating check calculation process of the present invention, as shown in FIG. 3.
Figure 5:
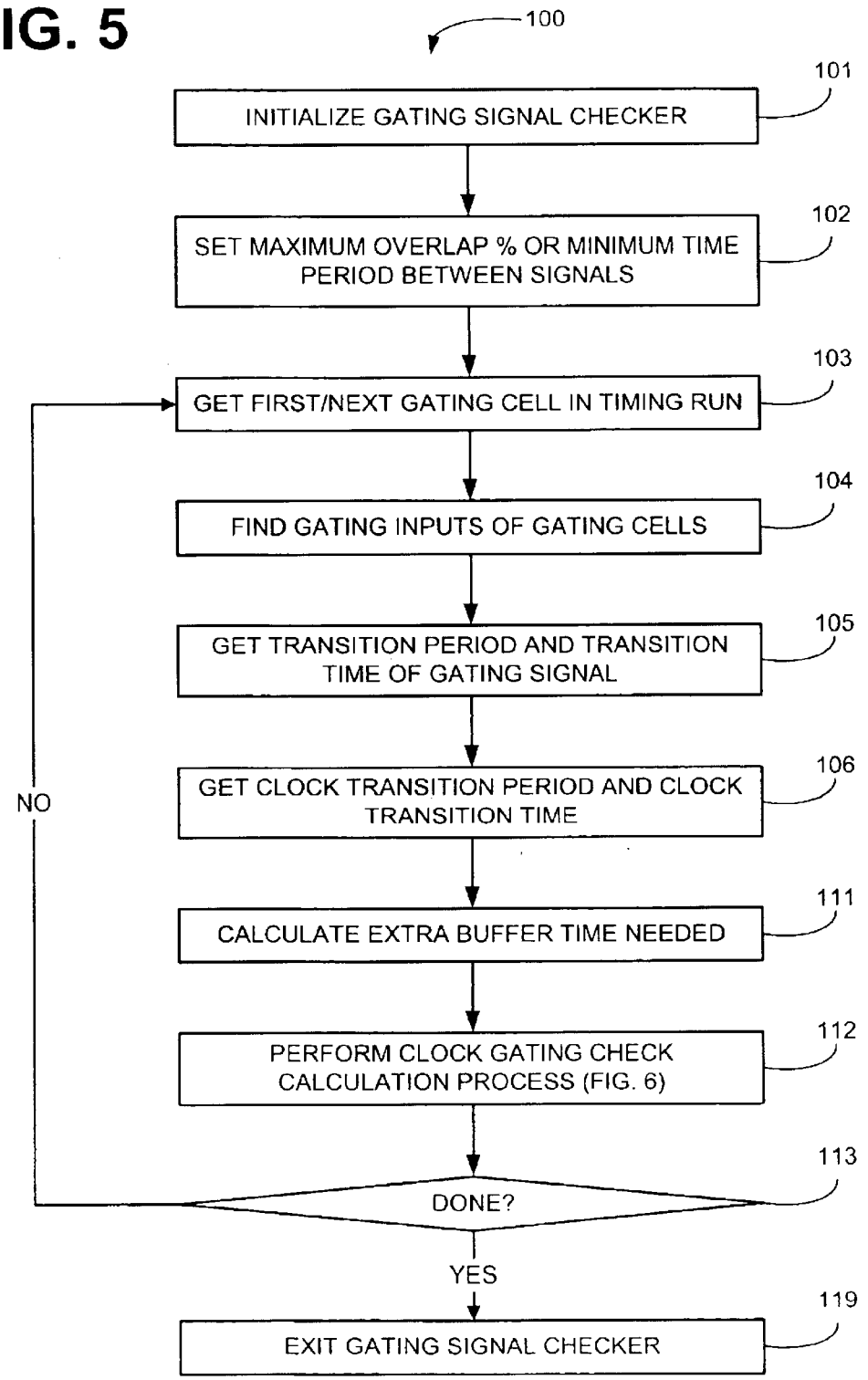
FIG. 5 is a flowchart illustrating one possible implementation of the gating signal checker of the present invention, as shown in FIGS. 3 and 4.
Figure 6:
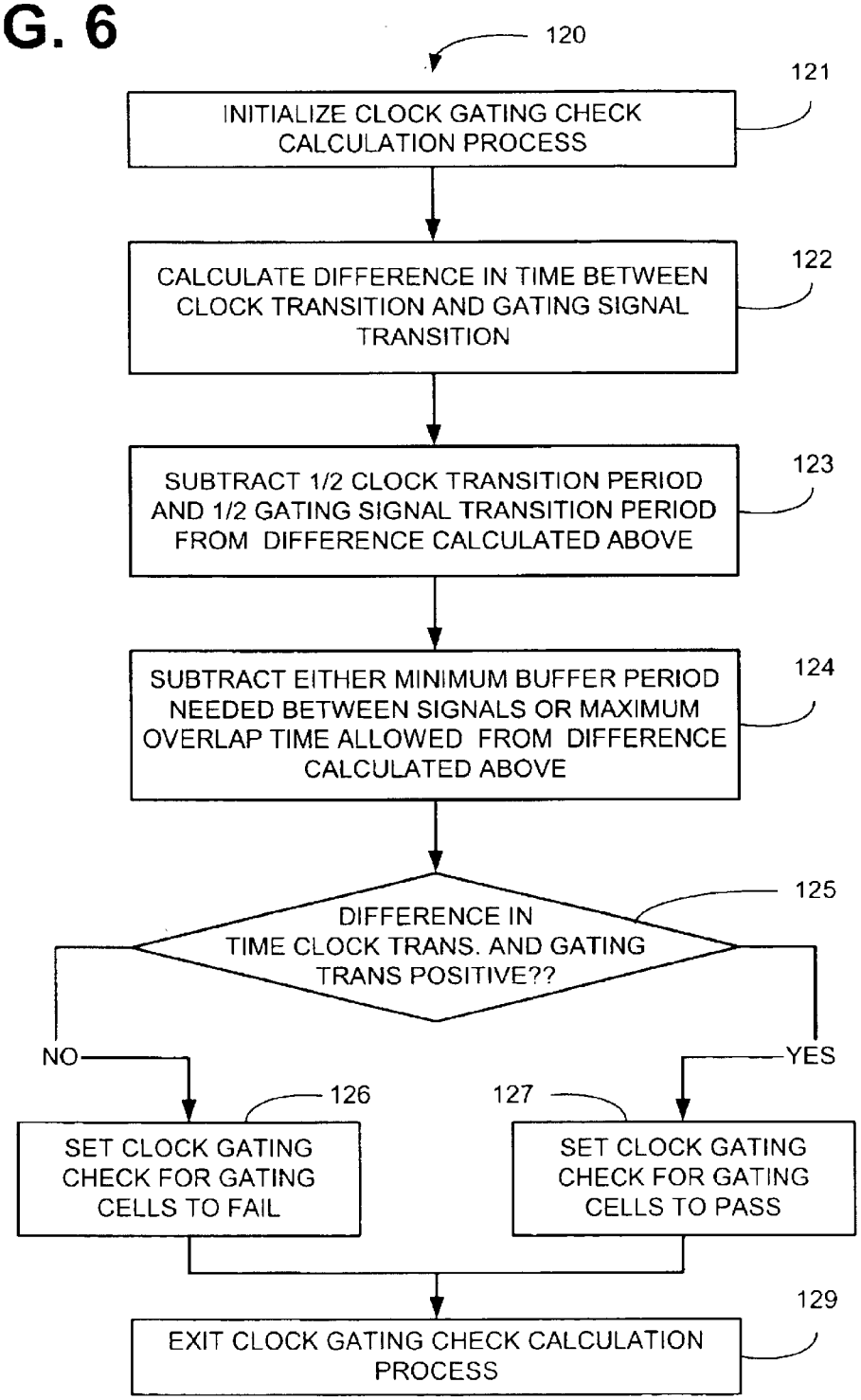
FIG. 6 is a flowchart illustrating one possible implementation of the method for performing the clock gating check calculation process as shown in FIGS. 3–5.

Having set forth the basic and probable circuit configurations of the various structures identified by the method of the present invention, reference is now made to FIGS. 4–6, which collectively comprise a block diagram and flow charts that illustrates the top-level functional operation of the gating signal checker 100 with the clock gating check calculation process 120 method in accordance with the preferred embodiment of the present invention.

Figure 1A:
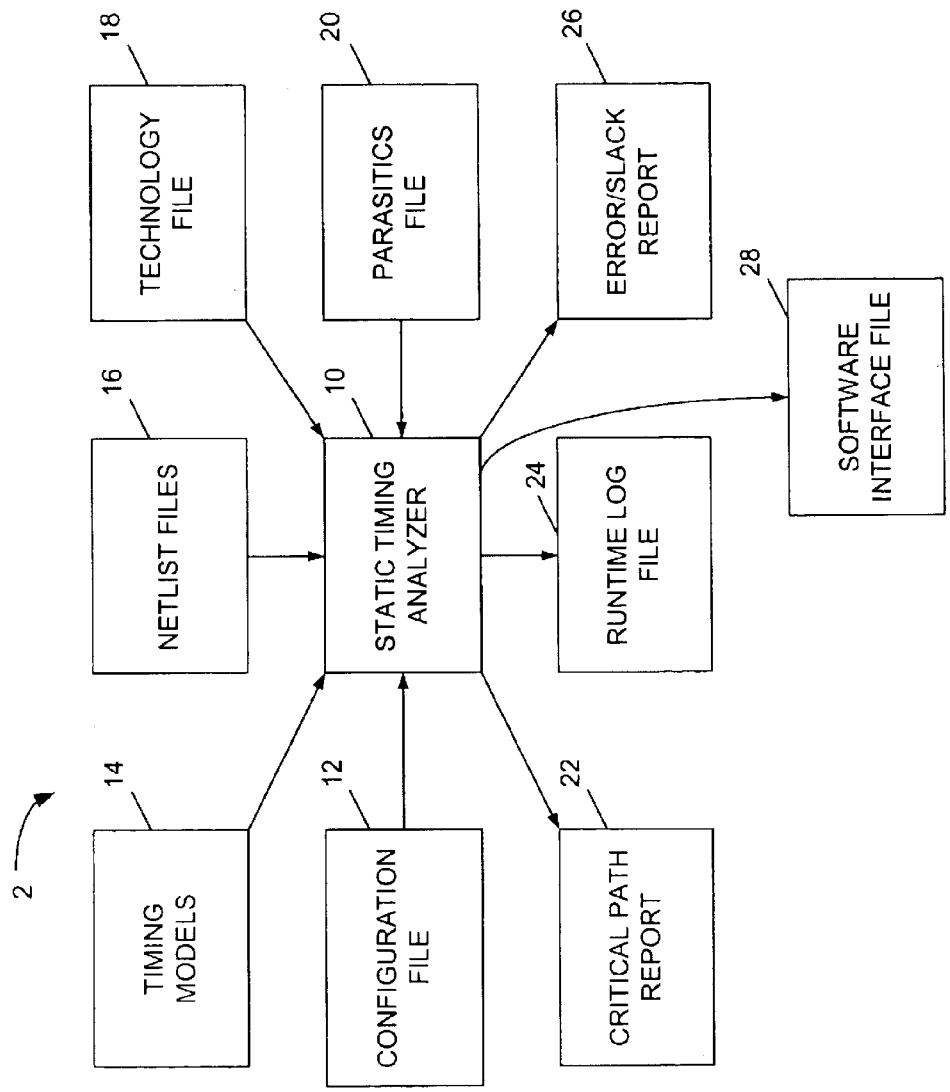
FIG. 1A is a block diagram of a static timing analyzer system, as is known in the prior art.

FIG. 4 is a block diagram illustrating one possible implementation of a gating signal checker 100 with the clock gating check calculation process 120 of the present invention, as shown in FIG. 3. In the illustrated embodiment, only the static timing analyzer 10, the configuration file 12 and the netlist file 16 from FIG. 1 are shown. The configuration file(s) 12 contains information that informs the static timing analyzer 10 how to perform its analysis, and various numbers of configuration files may be used. The netlist file 16, as is well known, defines the various integrated circuit components, and their inter-relations. The static timing analyzer 10 may make available to the gating signal checker 100 a data file output 32.

The static timing analyzer 10 typically uses a netlist (i.e. a Verilog® netlist), extracted parasitics and design constraints used for common representation of a hardware device. The static timing analyzer then loads the netlist design and parasitics into the system for representation of the hardware device. The design constraints are applied to the representation of the hardware device and a static timing run is then performed.

The gating signal checker 100 preferably is configured to operate on an output of the static timing analyzer 10. In this regard, the static timing analyzer may be configured to generate output netlist files 16, which the gating signal checker 100 utilizes as an input. As previously mentioned, there are a wide variety of reasons why a gating signal checker 100 may be desired. One such reason to utilize a gating signal checker 100 is to perform various checks over certain rules or strategies in an integrated circuit design. Such rules may vary from circuit to circuit, depending upon the particular application.

The gating signal checker 100 of the preferred embodiment of the present invention, operates to provide a method for determining the signal transition times in reference to the clock signal 42 (FIG. 1B), and the transition time of all gating signals for one gating cell. Then, the clock signal transition period can be determined. Each gating signal is compared to the clock signal for both set-up and hold of the clock signal for both transition period and transition time. If the time between the gating signal and clock signal minus one-half the transition period of each signal is greater than or equal to zero, no transition overlap has occurred and the clock gating check passes. However, if the value after subtraction is less than zero, then the clock gating check fails.

In the preferred embodiment, the gating signal checker 100 of the present invention is a stand-alone system and method that does not require additions to any operating static timing engine 10 currently being operated. However, in an alternative embodiment, the gating signal checker 100 of the present invention may be integrated into currently available static timing engines.

FIG. 5 is a flowchart depicting one possible implementation of the gating signal checker 100 with the clock gating check calculation process 120 of the present invention. The gating signal checker 100 of the present invention checks the transition times of a logic cell or element for correct transition operation. This is superior to previous methods in that it does not require a pre-calculation of a safety margin that is to be used. In another embodiment, the gating signal checker of the present invention also allows for significantly different transition periods between the clock and gating signals, and even between the individual gating signals if there is more than one.

First, the gating signal checker 100 initializes step 101. At step 102, the maximum overlap percentage or minimum time period between signals is set by the designer. At step 103, the gating signal checker 100 of the present invention gets the first or next gating cell in the timing run. After obtaining the gating cell at step 103, the gating signal checker 100 finds the gating inputs of the current gating cell at step 104. At step 105, the gating signal checker 100 gets the transition time and the transition period of the gating signals for the gating inputs. At step 106, the gating signal checker 100 gets the clock transition period and the clock transition time.

At step 111, the gating signal checker 100 calculates any extra buffer time necessary for proper operation. At step 112, the gating signal checker performs the clock gating check calculation process 120 (FIG. 6). The clock gating check calculation process is herein defined in further detail with regard to FIG. 6. After performing the clock gating check calculation process at step 112, the gating signal checker determines, at step 113, if there are more gating cells to be processed. If it is determined at step 113 that there are more gating cells to be processed, then the gating signal checker 100 returns to repeat steps 103 through 113. However, if it is determined at step 113 that there are no more gating cells to be processed, then the gating signal checker 100 exits at step 119.

FIG. 6 is a flowchart depicting one possible implementation of the clock gating check calculation process 120 utilized within the gating signal checker 100, as shown in FIGS. 3–5. The clock gating check calculation process 120 calculates the difference in time between the clock transition time 44 (FIG. 1C) and the gating signal transition time 46 (FIG. 1C). This enables the clock gating check calculation process 120 to determine if the logic cell passes the clock gating check.

First, the clock gating check calculation process 120 initializes step 121. At step 122, the clock gating check calculation process 120 then calculates the difference in time between the clock transition time 44 and the gating signal transition time 46. In some applications, these transition times may be relative to the clock cycle. At step 123, one-half of the clock transition period and one-half of the gating signal transition period is subtracted from the difference calculated at step 122 above. One-half of these transition periods are used to ensure that these signals have completed their respective transitions in order for the clock gating check to be performed.

At step 124, the clock gating check calculation process 120 subtracts either the minimum buffer period needed between signals or the maximum overlap time allowed from the difference calculated at step 123 above. In an optimistic scenario, a designer may allow some maximum overlap time in the transition time of the signals being compared. However, allowing transition overlap increases the chances of glitches due to lagging transition times. To ensure the correctness of the circuitry, a designer may incorporate a minimum buffer period between transition signals to ensure that the signals complete their transition and, therefore, that the design is in its most robust state. This minimum buffer period can optionally include an extra buffer time period.

At step 125, the clock gating check calculation process 120 determines the difference between the clock transition time and gating transition time, and determines if that signal difference is equal to zero or is positive. If the signal difference is positive, the designer is notified and can be assured that there is sufficient time between the transition period of the clock signal and the transition period of the gating signal. If the signal difference is zero, the designer is notified that there is just enough time between the transition period of the clock signal and the transition period of the gating signal. However, if it is determined that the signal difference is negative, then the designer is notified that the clock gating check, in reference to the clock gating signal and clock transition, is in violation of the parameters set forth prior to the execution of the clock gating check. Typically, the designer is notified of the clock gating check results by messages on display 67 (FIG. 3), however, it is understood that the notices generated can be compiled and output in a report on an optional printer device.

If it is determined at step 125 that the signal difference is negitive, then the clock gating calculation process 120 sets the clock gating check to "fail" for the current gating cell and notifies the designer of the failure, at step 126. The clock gating check calculation process 120 exits at step 129. However, if it is determined at step 125 that the signal difference in the time the clock transition is positive, then the clock gating check is set to "pass" for the current gating cell and notifies the designer of the success at step 127. The clock gating check calculation process 120 exits at step 129.

Having described the method of the present invention, it will be appreciated that the steps illustrated in the flow charts of FIGS. 5 and 6 are provided for purposes of illustration and are not deemed to be limiting on the broader aspects of the present invention. Indeed, the broader aspects of the present invention may be implemented using a variety of different approaches that are still consistent with the scope and content of the present invention.

It should be appreciated that the flow charts of FIGS. 5 and 6 show the top-level operation of only one possible implementation of the methods of the present invention. In this regard, when implemented in software or firmware, as in the case of the preferred embodiment, each block represents a module, segment, or portion of code, which comprises one or more executable instructions for implementing the specified logical function(s). It should also be noted that in some alternative implementations, the functions noted in the blocks may occur out of the order shown. For example, two blocks shown in succession may in fact be executed substantially concurrently or the blocks may sometimes be executed in the reverse order, depending upon the functionality involved.

Figure 1B:
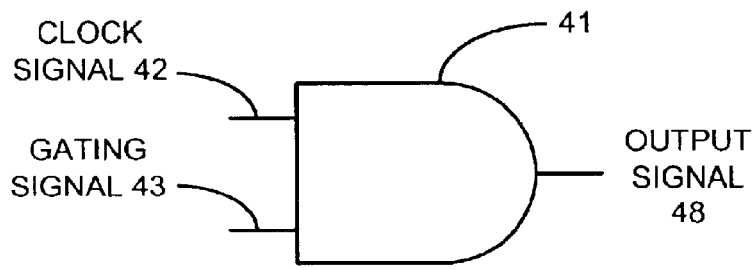
FIG. 1B is an example of a clock gating cell, as known in the prior art.
Figure 1C:
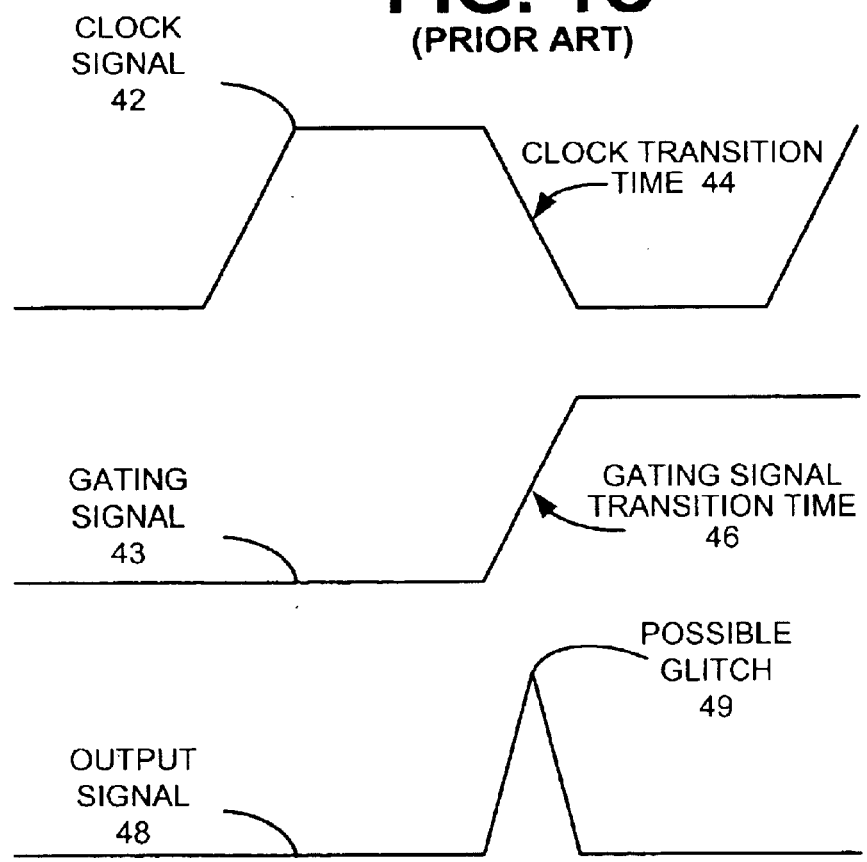
FIG. 1C is a block diagram illustrating the input signals that can cause a glitch in a logic cell, as known in the prior art.
Figure 2A:
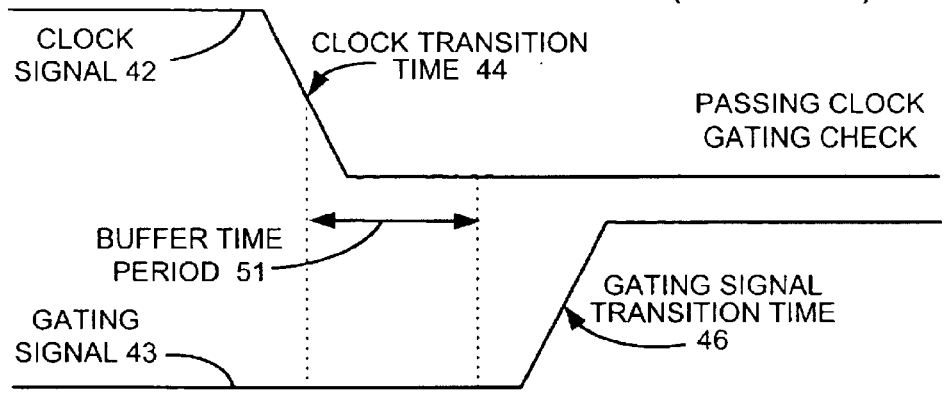
FIGS. 2A–2C are block diagrams illustrating the states that occur when performing a clock gating check, as is known in the prior art.
Figure 2B:
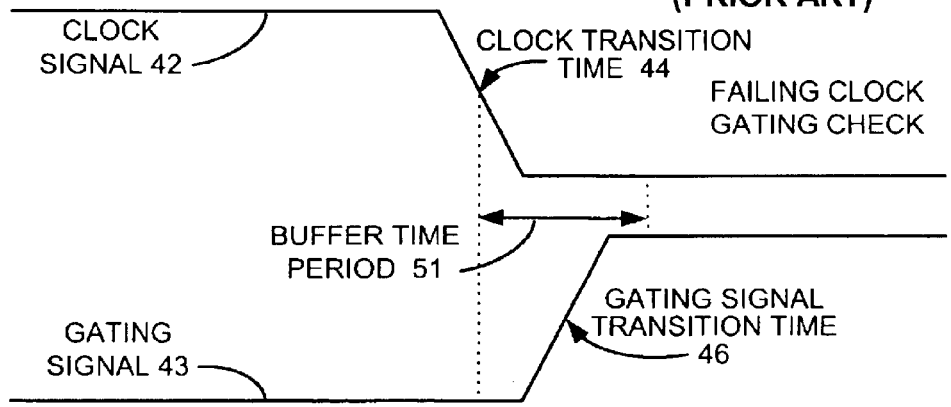
Figure 2C:
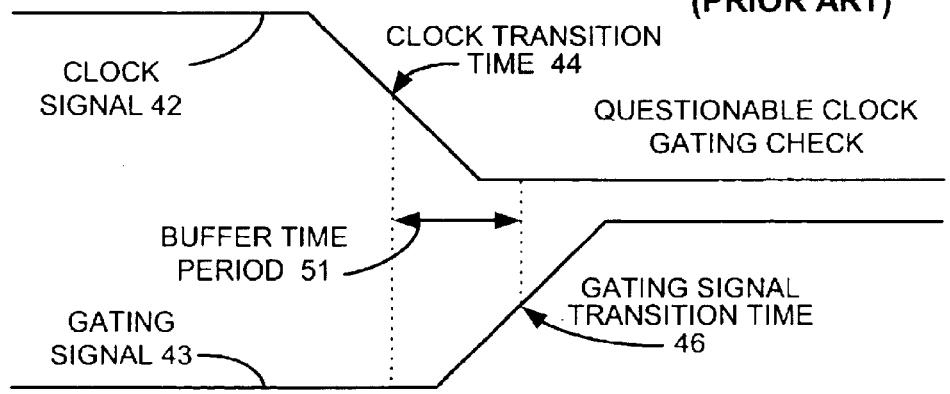

In the following illustrated embodiments in FIGS. 7A–7D, the gating signal checker 100 of the present invention determines the clock transition time 44 in reference to the gating signal transition time 46 for one gating cell 41 (FIG. 1B). Upon determining these signal transition times, the difference in the clock transition time 44 and gating signal transition time 46 can be determined. Each gating signal is compared to the clock signal 42 for both set-up and hold both in transition time period and in transition time. The transition time indicates the point at which the signal changes from one state to another, and the transition period is the period needed for a signal to completely transition from one state to another.

Figure 7A:
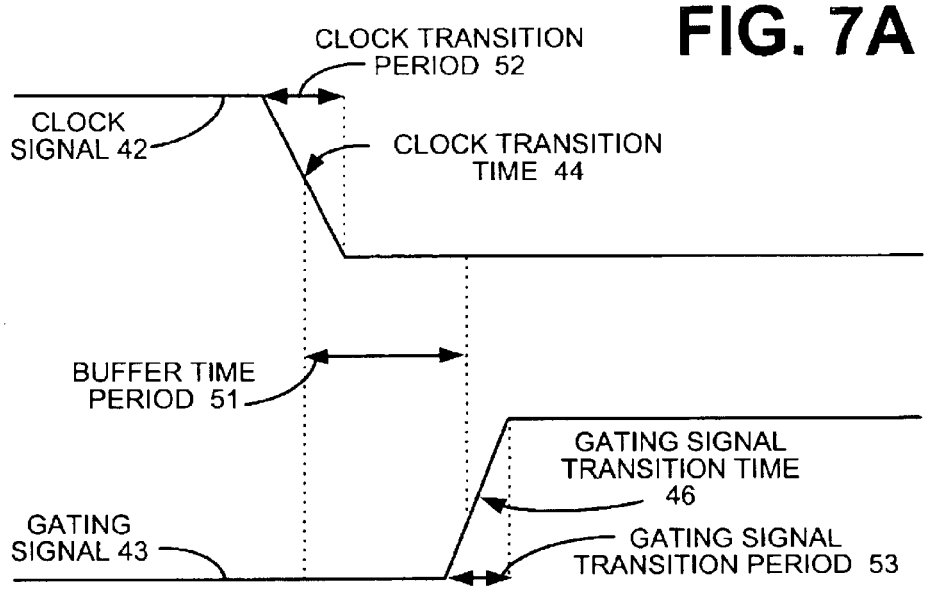
FIG. 7A is a block diagram illustrating an example of a clock signal and gating signal that passed the gating signal check of the present invention as illustrated in FIGS. 3–6.

FIG. 7A is a block diagram illustrating an example of a clock signal 42 and gating signal 43 that passes the gating signal check of the present invention as illustrated in FIGS. 3–6. If the time between the gating signal 43 and the clock signal 42, minus one-half of the transition period for each signal is greater than zero, then no transition overlap has occurred and the clock gating check will pass. Assume for the purposes of illustration only that the clock transition period 52 and buffer time period 51 are 150 pico seconds (pS) each, and the gating signal transition period 53 is 100 pico seconds. Then, the clock gating check passes since, 150 pS−((100 pS+150 pS)/2)=25 pS and is positive.

Figure 7B:
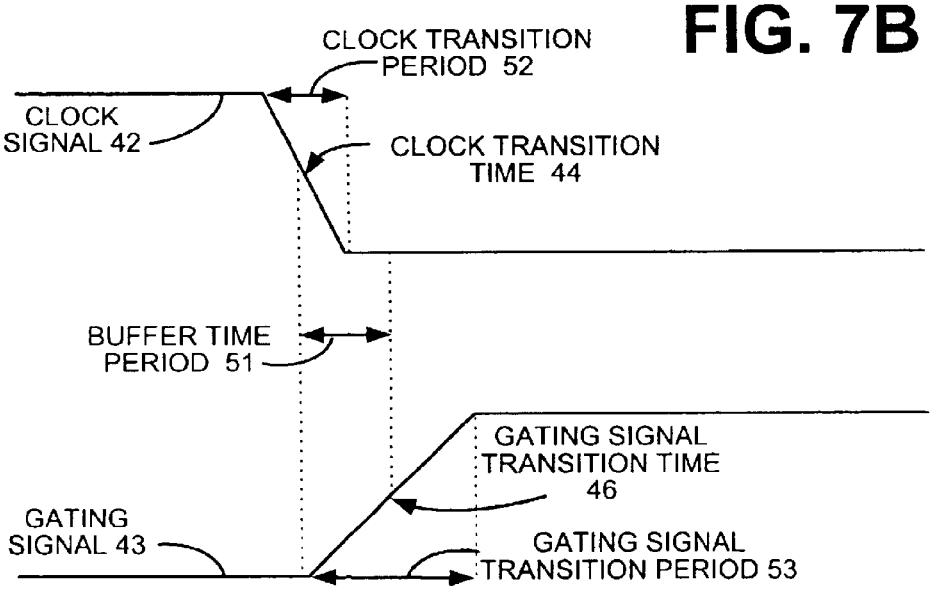
FIG. 7B is a block diagram illustrating an example of a clock signal and gating signal failing the gating signal check of the present invention as illustrated in FIGS. 3–6.

FIG. 7B is a block diagram illustrating one example of a clock signal 42 and gating signal 43 that fails the gating signal check of the present invention as illustrated in FIGS. 3–6. If the value after subtraction is less than zero, then the clock gating check will fail. Assume for the purposes of illustration only that the clock transition period 52 is 150 pico seconds, buffer time period 51 is 100 pico seconds, and the gating signal transition period 53 is 200 pico seconds. Then, the clock gating check fails since, 100 pS−((105 pS+200 pS)/2)=−75 pS and is negative.

Figure 7C:
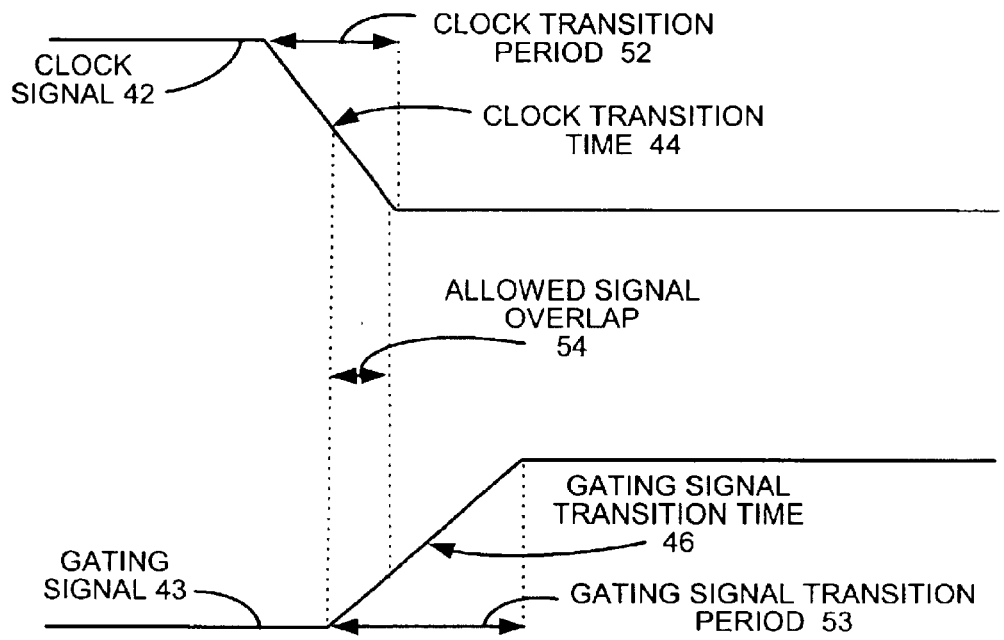
FIG. 7C is a block diagram illustrating one example of a clock signal and gating signal showing allowable signal overlap that passes the gating signal check of the present invention as shown in FIGS. 3–6.

FIG. 7C is a block diagram illustrating one example of a clock signal and gating signal showing allowable signal overlap that passes the gating signal check of the present invention as shown in FIGS. 3–6. It is possible to have allowable overlap that can be specified for each type of signal. This would allow the overlap up to an amount specified while still passing the clock signal check. Assume for the purposes of illustration only that the clock transition period 52 and buffer time period 51 are 150 pico seconds, the gating signal transition period 53 is 200 pico seconds, and the allowed signal overlap 54 is 25%. Therefore, the clock transition period 52 and gating signal transition period 53 need to factor in only 75% of their respective periods. Then, the clock gating check passes since, 150 pS−((150 pS*75%)+(200 pS*75%))/2)=18.75 and is positive.

Figure 7D:
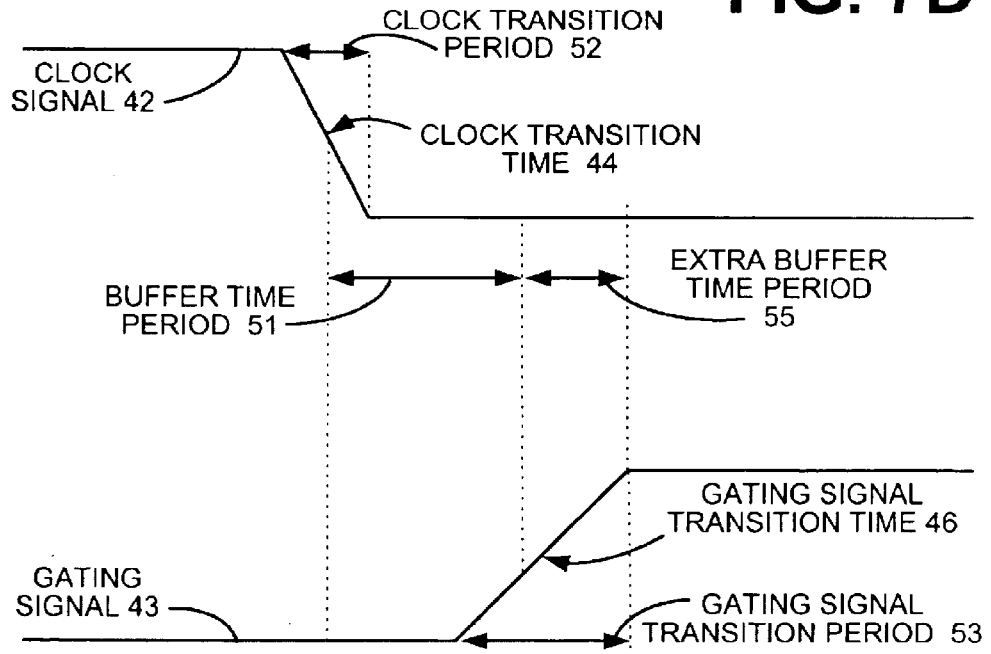
FIG. 7D is a block diagram illustrating one example of a clock signal and gating signal with an extra time buffer that passes the signal gating check of the present invention as illustrated in FIGS. 3–6.

FIG. 7D is a block diagram illustrating one example of a clock signal 42 and gating signal 43 with an extra buffer time period 55 that passes the signal gating check of the present invention as illustrated in FIGS. 3–6. If extra time is desired, the designer can also specify an extra buffer time that would be included between the signals being tested. Assume for the purposes of illustration only that the clock transition period 52 is 150 pS, the buffer time period 51 is 225 pico seconds, the gating signal transition period 53 is 200 pico seconds, and the extra buffer time period 55 is 50 pS. Then, the clock gating check just passes since, 225 pS–((150 pS+200 pS)/2)–50=0 and is not negative.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for performing a clock gating check on a logic cell comprising the steps of:
   determining a clock transition time of a clock signal input into the logic cell;
   determining a transition time of at least one gating signal input into the logic cell;
   calculating a clock difference time between the clock transition time and the transition time of the at least one gating signal input into the logic cell;
   determining that the logic cell passes the clock gating check if the clock difference time is not negative;
   subtracting approximately one-half of a clock transition period from the clock difference time; and
   subtracting approximately one-half of a gating signal transition period from the clock difference time.

2. The method as defined in claim 1, further comprising:
   subtracting a minimum buffer period from the clock difference time.

3. The method as defined in claim 1, further comprising:
   subtracting a maximum overlap time period from the clock difference time.

4. The method as defined in claim 1, further comprising:
   subtracting a reserve buffer time period from the clock difference time.

5. A system for performing a clock gating check on a logic cell comprising:
   means for determining a clock transition time of a clock signal input into the logic cell;
   means for determining a transition time of at least one gating signal input into the logic cell;
   means for calculating a clock difference time between the clock transition time and the transition time of the at least one gating signal input into the logic cell; and
   means for determining that the logic cell passes the clock gating check if the clock difference time is not negative;
   means for subtracting approximately half of a clock transition period from the clock difference time; and
   means for subtracting approximately half of a gating signal transition period from the clock difference time.

6. The system of claim 5, further comprising:
   means for subtracting a minimum buffer period from the clock difference time.

7. The system of claim 5, further comprising:
   means for subtracting a maximum overlap time period from the clock difference time.

8. The system of claim 5, further comprising:
   means for subtracting a reserve buffer time period from the clock difference time.

9. A computer readable storage medium containing program code for performing a clock gating check on a logic cell comprising:
   a first code segment configured to determine a clock transition time of a clock signal input into the logic cell;
   a second code segment configured to determine a transition time of at least one gating signal input into the logic cell;
   a third code segment configured to calculate a clock difference time between the clock transition time and the transition time of the at least one gating signal input into the logic cell; and
   a fourth code segment configured to determine that the logic cell fails the clock gating check if the clock difference time is negative;
   wherein said third code segment is further configured to:
      subtract approximately half of a clock transition period from the clock difference time; and
      subtract approximately half of a gating signal transition period from the clock difference time.

10. The program code of claim 9, wherein said third code segment is further configured to subtract a minimum buffer period from the clock difference time.

11. The program code of claim 9, wherein said third code segment is further configured to subtract a maximum overlap time period from the clock difference time.

12. The program code of claim 9, wherein said third code segment is further configured to subtract a reserve buffer time period from the clock difference time.

13. A clock gating check system that performs clock gating check on a logic cell comprising:
   logic that determines a clock transition time of a clock signal input into the logic cell;
   logic that determines a transition time of at least one gating signal input into the logic cell;
   logic that calculates a clock difference time between the clock transition time and the transition time of the at least one gating signal input into the logic cell; and
   logic that determines the logic cell fails the clock gating check if the clock difference time is negative;
   logic that subtracts approximately half of a clock transition period from the clock difference time; and
   logic that subtracts approximately half of a gating signal transition period from the clock difference time.

14. The clock gating check system of claim 13, further comprising:
   logic that subtracts a minimum buffer period from the clock difference time.

15. The clock gating check system of claim 13, further comprising:
   logic that subtracts a maximum overlap time period from the clock difference time.

16. The clock gating check system of claim 13, further comprising:
   logic that subtracts a reserve buffer time period from the clock difference time.

17. A method for performing a clock gating check on a logic cell comprising the steps of:
   providing a timing database comprising clock signal and gating signal timing information, wherein the timing information includes information about a clock transition time of a clock signal to be input into the logic cell and a transition time of at least one gating signal to be input into the logic cell;

determining that there is no transition overlap between the clock transition time and the transition time of the at least one gating signal; and determining that the logic cell passes the clock gating check responsive to the step of determining that there is no transition overlap.

18. The method of claim 17, wherein the step of determining that there is no transition overlap comprises:

calculating a clock difference time between the clock transition time and the transition time of the at least one gating signal.

19. A method for performing a clock gating check on a logic cell comprising the steps of:

providing a timing database comprising clock signal and gating signal timing information, wherein the timing information includes information about a clock transition time of a clock signal to be input into the logic cell and a transition time of at least one gating signal to be input into the logic cell;

determining that there is no transition overlap between the clock transition time and the transition time of the at least one gating signal;

determining that the logic cell passes the clock gating check responsive to the step of determining that there is no transition overlap;

calculating a clock difference time between the clock transition time and the transition time of the at least one gating signal;

subtracting approximately one-half of a clock transition period from the clock difference time; and subtracting approximately one-half of a gating signal transition period from the clock difference time.

20. A system for performing a clock gating check on a logic cell comprising:

means for providing a timing database comprising clock signal and gating signal timing information, wherein the timing information includes information about a clock transition time of a clock signal to be input into the logic cell and a transition time of at least one gating signal to be input into the logic cell; and means for determining that there is no transition overlap between the clock transition time and the transition time of the at least one gating signal input into the logic cell.

21. The system of claim 20, further comprising:

means for determining that the logic cell passes the clock gating check responsive to the step of determining that there is no transition overlap.

22. A system for performing a clock gating check on a logic cell, the system comprising:

memory having stored therein a timing database comprising clock signal and gating signal timing information, wherein the timing information includes information about a clock transition time of a clock signal to be input into the logic cell and a transition time of at least one gating signal to be input into the logic cell; and at least one processor that is programmed to determine that there is no transition overlap between the clock transition time and the transition time of the at least one gating signal.

23. The system of claim 22, wherein the at least one processor is programmed to calculate a clock difference time between the clock transition time and the transition time of the at least one gating signal.

24. A system for performing a clock gating check on a logic cell, the system comprising:

memory having stored therein a timing database comprising clock signal and gating signal timing information, wherein the timing information includes information about a clock transition time of a clock signal to be input into the logic cell and a transition time of at least one gating signal input to be into the logic cell; and at least one processor that is programmed to determine that there is no transition overlap between the clock transition time and the transition time of the at least one gating signal;

wherein the at least one processor is programmed to calculate a clock difference time between the clock transition time and the transition time of the at least one gating signal; and wherein the at least one processor is programmed to subtract approximately one-half of a clock transition period from the clock difference time, and to subtract approximately one-half of a gating signal transition period from the clock difference time.

25. A method for performing a clock gating check on a logic cell comprising the steps of:

providing a clock transition value of a clock signal to be input into the logic cell and a transition value of at least one gating signal to be input into the logic cell;

providing a value indicating a permissible level of overlap between the clock transition value and the transition value of the at least one gating signal; and determining that a transition overlap between the clock transition value and the transition value of the at least one gating signal does not exceed the permissible level of overlap.

26. The method of claim 25, further comprising:

determining that the logic cell passes the clock gating check responsive to the step of determining that the transition overlap between the clock transition value and the transition value of the at least one gating signal does not exceed the permissible level of overlap.

27. The method of claim 25, wherein the clock transition value and the transition value of the at least one gating signal are specified in a timing database.

28. The method of claim 27, wherein the value indicating a permissible level of overlap is specified in a control file corresponding to the timing database.

* * * * *